United States Patent
Kalchuri et al.

(10) Patent No.: US 9,530,714 B2
(45) Date of Patent: Dec. 27, 2016

(54) LOW-PROFILE CHIP PACKAGE WITH MODIFIED HEAT SPREADER

(71) Applicant: NVIDIA Corporation, Santa Clara, CA (US)

(72) Inventors: Shantanu Kalchuri, San Jose, CA (US); Abraham F. Yee, Cupertino, CA (US); Leilei Zhang, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/714,289

(22) Filed: Dec. 13, 2012

(65) Prior Publication Data

US 2014/0167216 A1    Jun. 19, 2014

(51) Int. Cl.
| | |
|---|---|
| H01L 23/34 | (2006.01) |
| H01L 23/367 | (2006.01) |
| H01L 23/36 | (2006.01) |
| H01L 25/16 | (2006.01) |
| H01L 23/50 | (2006.01) |
| H01L 23/64 | (2006.01) |

(52) U.S. Cl.
CPC ........... *H01L 23/3675* (2013.01); *H01L 23/36* (2013.01); *H01L 23/50* (2013.01); *H01L 25/16* (2013.01); *H01L 23/64* (2013.01); *H01L 2224/16225* (2013.01); *H01L 2924/15311* (2013.01); *H01L 2924/19105* (2013.01)

(58) Field of Classification Search
CPC ................. H01L 23/34; H01L 23/367

USPC .................. 257/712, 713; 361/710
See application file for complete search history.

(56) References Cited

U.S. PATENT DOCUMENTS

| | | | | |
|---|---|---|---|---|
| 5,623,394 | A * | 4/1997 | Sherif et al. | 361/705 |
| 5,819,402 | A * | 10/1998 | Edwards | H01L 23/42 |
| | | | | 165/80.2 |
| 5,909,056 | A | 6/1999 | Mertol | |
| 6,081,037 | A * | 6/2000 | Lee | H01L 23/13 |
| | | | | 257/706 |
| 6,665,187 | B1 * | 12/2003 | Alcoe | H01L 23/10 |
| | | | | 165/185 |
| 6,979,899 | B2 * | 12/2005 | Edwards | H01L 23/36 |
| | | | | 257/704 |
| 7,031,162 | B2 * | 4/2006 | Arvelo | H01L 23/3675 |
| | | | | 257/707 |
| 7,551,435 | B2 * | 6/2009 | Taniguchi et al. | 361/679.53 |
| 7,944,046 | B2 * | 5/2011 | Chao | H01L 23/10 |
| | | | | 165/185 |
| 2005/0047094 | A1 * | 3/2005 | Hsu | H01L 23/367 |
| | | | | 361/704 |
| 2005/0156310 | A1 | 7/2005 | Benner et al. | |
| 2006/0060952 | A1 | 3/2006 | Yuan et al. | |
| 2008/0055860 | A1 | 3/2008 | Taniguchi et al. | |

(Continued)

*Primary Examiner* — Michael Lebentritt
*Assistant Examiner* — Jordan Klein
(74) *Attorney, Agent, or Firm* — Artegis Law Group, LLP

(57) ABSTRACT

An integrated circuit system includes a heat spreader that is thermally coupled to a semiconductor chip and has a cavity or opening formed in the heat spreader. The cavity or opening is positioned so that capacitors and/or other passive components mounted to the same packaging substrate as the semiconductor chip are at least partially disposed in the cavity or opening. Because the passive components are disposed in the cavity or opening, the integrated circuit system has a reduced package thickness.

27 Claims, 4 Drawing Sheets

(56) References Cited

U.S. PATENT DOCUMENTS

2008/0186184 A1\* 8/2008 August ................. G06F 21/88
340/572.7
2010/0195284 A1\* 8/2010 Zheng ......................... 361/697
2012/0250260 A1\* 10/2012 Burton ................... G06F 1/181
361/720

\* cited by examiner

LOW-PROFILE CHIP PACKAGE WITH MODIFIED HEAT SPREADER

BACKGROUND OF THE INVENTION

Field of the Invention

Embodiments of the present invention relate generally to integrated circuit chip packaging and, more specifically, to a low-profile chip package with modified heat spreader.

Description of the Related Art

In the packaging of integrated circuit (IC) chips, it is generally desirable to minimize the size and thickness of chip packages. In mobile computing devices, such as smart phones, laptop computers, electronic tablets, and the like, it is particularly desirable to minimize the thickness of IC packages, so that such mobile devices can be further reduced in size and weight. In general, however, the thickness of a typical IC package cannot be easily reduced due to mechanical interference between the various components of the chip package. This is especially true for IC packages that include capacitors or other passive devices that are mounted to the same substrate as the IC chip, since such external devices can contribute more to the thickness of the IC package than the IC chip itself, and thereby limit the minimum thickness of the IC package.

Accordingly, there is a need in the art for an IC package that has a reduced thickness.

SUMMARY OF THE INVENTION

One embodiment of the present invention sets forth an integrated circuit system having a reduced package thickness. The IC system includes a heat spreader that is thermally coupled to a semiconductor chip and has a cavity or opening formed in the heat spreader. The cavity or opening is positioned so that capacitors and/or other passive components mounted to the packaging substrate are at least partially disposed in the cavity or opening.

One advantage of the present invention is that interference between passive devices mounted on the packaging substrate and the heat spreader is eliminated, so that the thickness of the IC system is only limited by the thickness of the IC chip and heat spreader.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
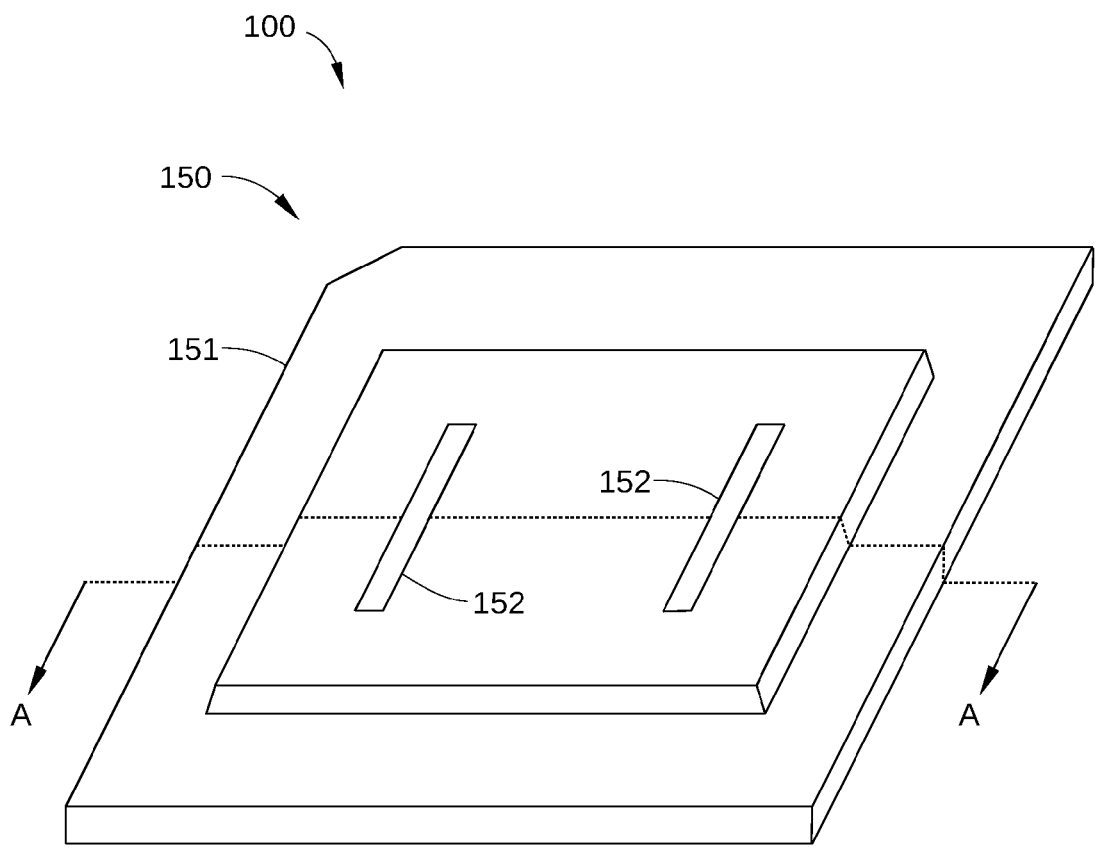
FIG. 1 is a schematic perspective view of an integrated circuit system, arranged according to one embodiment of the invention.

FIG. 1 is a schematic perspective view of an integrated circuit (IC) system 100, arranged according to one embodiment of the invention. IC system 100 includes an IC chip (illustrated in FIG. 2) and an associated package assembly 150 that is configured to electrically and mechanically connect the IC chip to a printed circuit board. As shown, IC system 100 further includes a heat spreader 151 that has one or more openings 152 formed therein.

Figure 2:
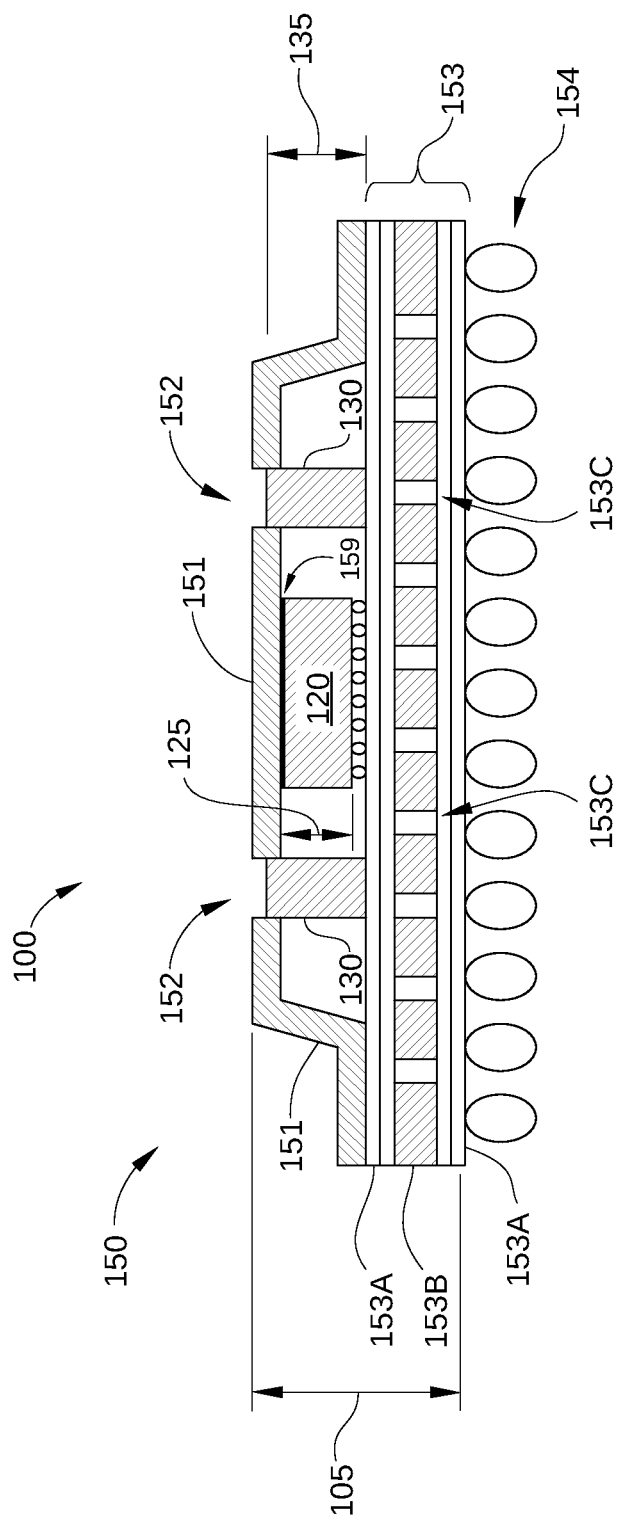
FIG. 2 is a schematic cross-sectional view of the IC system in FIG. 1, taken at section A-A in FIG. 1.

FIG. 2 is a schematic cross-sectional view of IC system 100, taken at section A-A in FIG. 1. IC system 100 includes an IC chip 120, one or more passive components 130, and package assembly 150. Package assembly 150 includes heat spreader 151, openings 152 formed therein, a packaging substrate 153, and packaging leads 154.

IC chip 120 is a semiconductor chip, such as a central processing unit (CPU), a graphics processing unit (GPU), application processor, a memory device or other logic device, a system-on-chip, or any semiconductor chip that generates enough heat during operation to benefit from the use of heat spreader 151. Generally, IC chip 120 is an unencapsulated die that is not contained in a chip carrier or package. Furthermore, IC chip 120 and is mounted on and electrically connected to packaging substrate 153. In the embodiment illustrated in FIG. 2, IC chip 120 is electrically connected to electrical packaging substrate 153 via microbumps soldered to bond pads formed on packaging substrate 153. However, electrical connections between IC chip 120 and packaging substrate 153 may be made using any technically feasible approach known in the art without exceeding the scope of the invention. Underfill, overmold, or any other technically feasible packaging techniques may be used to protect the electrical connections between IC chip 120 and packaging substrate 153.

Passive components 130 are also mounted on and electrically connected to packaging substrate 153, and may include decoupling capacitors, resistors, inductors, or any other passive electrical components mounted to packaging substrate 153. Decoupling capacitors are typically used to reduce noise in power and signal connections to IC chip 120 during operation, and inductors and resistors mounted on packaging substrate 153 may be used to perform similar functions. As the size of IC chips, such as IC chip 120, is progressively reduced in thickness, passive components 130 mounted on packaging substrate 153 can extend farther above packaging substrate 153 than IC chip 120. Specifically, height 135 of passive components 130 can be greater than thickness 125 of IC chip 120. Consequently, a minimum thickness 105 of IC system 100 is limited by height 135 of passive components 130 rather than by thickness 125 of IC chip 120. However, according to embodiments of the invention, cavities or slots 152 are formed in heat spreader 151 and aligned with passive components 130, so that passive components 130 are partially disposed in said cavities or slots 152. In this way, height 135 of passive components 130 can be greater than thickness 125 of IC chip 120 without increasing minimum thickness 105 of IC system 100.

Package assembly 150 protects IC chip 120 from ambient moisture and other contamination, minimizes mechanical shock and stress on IC chip 120, and facilitates electrical connections between IC chip 120 and a printed circuit board or other mounting substrate external to IC system 100. Heat spreader 151 of package assembly 150 is thermally coupled to IC chip 120 to enhance transmission of heat generated by IC chip 120. In some embodiments, heat spreader 151 is formed from a single piece of metal having a relatively high thermal conductivity, such as a stamped copper or aluminum plate. Suitable materials for heat spreader 151 include copper, aluminum, or any other metal having a thermal conductivity that is at least equal to the thermal conductivity of aluminum, i.e., at least about 230 W m$^{-1}$ K$^{-1}$.

In some embodiments, heat spreader 151 is thermally coupled to IC chip 120 by being placed in direct contact therewith. In the embodiment illustrated in FIG. 2, heat spreader 151 is thermally coupled to IC chip 120 via a thermal interface material 159 disposed therebetween. Thermal interface material 159 is a thin layer of thermally conductive material configured to maximize conductive heat transfer between IC chip 120 and heater spreader 151. Suitable materials for thermal interface material 159 include thermally conductive gels, thermal greases, solders, or a thermally conductive sheet, such as a mechanically compressible gap pad.

In addition, heat spreader 151 includes one or more cavities or openings, such as slots 152, which are aligned with one or more components mounted on packaging substrate 150, such as passive components 130. Because slots 152 are aligned with passive components 130, passive components 130 are partially disposed in slots 152 and minimum thickness 105 of IC system 100 is significantly reduced. In some embodiments, such openings or cavities in heat spreader 151 extend completely through heat spreader 151, as shown in FIGS. 1 and 2. In such embodiments, slots 152 may be formed by any technically feasible approach, such as machining, stamping, and the like. In other embodiments, the cavities formed in heat spreader 151 do not necessarily extend through heat spreader 151. One such embodiment is described below in conjunction with FIG. 3.

Packaging substrate 153 provides IC system 100 with structural rigidity as well as an electrical interface for routing input and output signals and power between IC chip 120 and a printed circuit board or other mounting device. Packaging substrate 153 is generally a rigid and typically thermally insulating substrate on which IC chip 120 is mounted. In some embodiments, packaging substrate 153 is a laminate-based substrate and is composed of a stack of build-up layers 153A or laminates that are built up on the top and bottom surfaces of a core 153B. Interconnect layers formed in build-up layer 153A and conductive vias 153C formed in core 153B provide conductive traces between IC chip 120 and packaging leads 154. While the embodiment of embodiment of IC system 100 illustrated in FIG. 2 includes two build-up layers 153A on each surface of core 153B, it is understood that packaging substrate 153 may instead have more or fewer build-up layer 153A without exceeding the scope of the invention. Furthermore, in some embodiments, packaging substrate 153 comprises any suitable substrate structure for the mounting of IC chip 120 and passive components 130. For example, in some embodiments, packaging substrate 153 may be an interposer substrate rather than a laminate-based packaging substrate. In such an embodiment, the interposer substrate may be formed from a semiconductor wafer, has one or more layers of interconnects formed thereon, and may include through-silicon vias to facilitate electrical connections from one side of the interposer to the other.

Packaging leads 154 provide electrical connections between IC system 100 and a mounting substrate external to IC system 100, such as a printed circuit board. Packaging leads 154 may include any technically feasible chip package electrical connection known in the art, including a ball-grid array (BGA), a pin-grid array (PGA), and the like.

Figure 3:
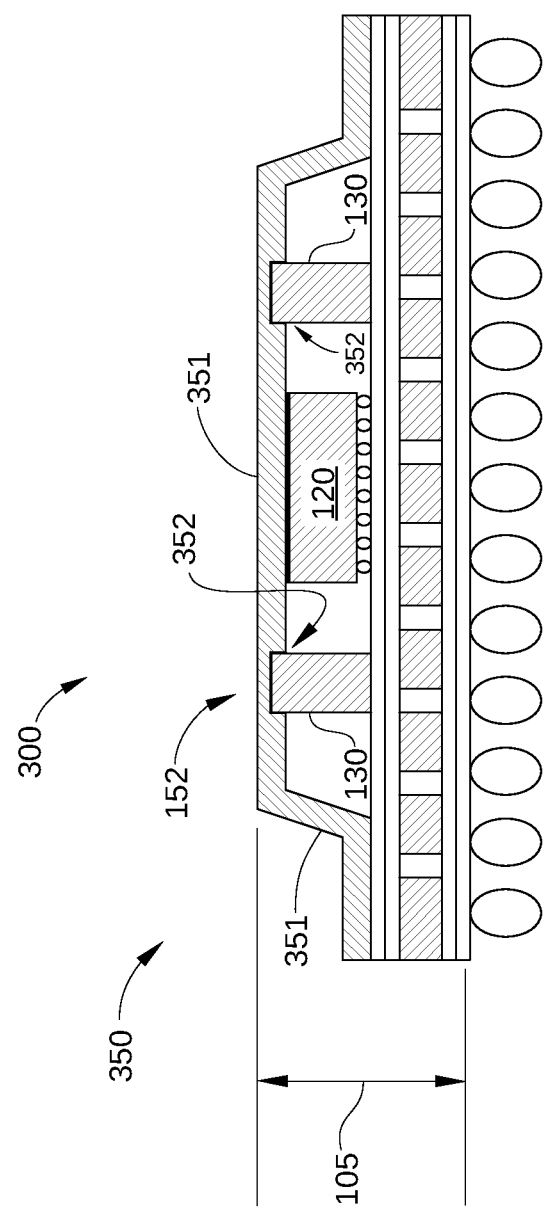
FIG. 3 is a schematic cross-sectional view of an IC system, arranged according to another embodiment of the invention.

FIG. 3 is a schematic cross-sectional view of an IC system 300, arranged according to another embodiment of the invention. IC system 300 is substantially similar in organization and operation to IC system 100 in FIG. 2, and includes IC chip 120, one or more passive components 130, and a package assembly 350. Package assembly 350 differs from package assembly 150 in FIG. 2 in that package assembly 350 includes a heat spreader 351 with cavities 352 formed therein rather than openings formed completely through heat spreader 351. As shown, cavities 352 are aligned with passive components 130 so that passive components 130 are partially disposed therein, thereby reducing minimum thickness 105 of IC system 300. Cavities 352 may be formed by machining or by any other technically feasible approach known in the art.

Figure 4:
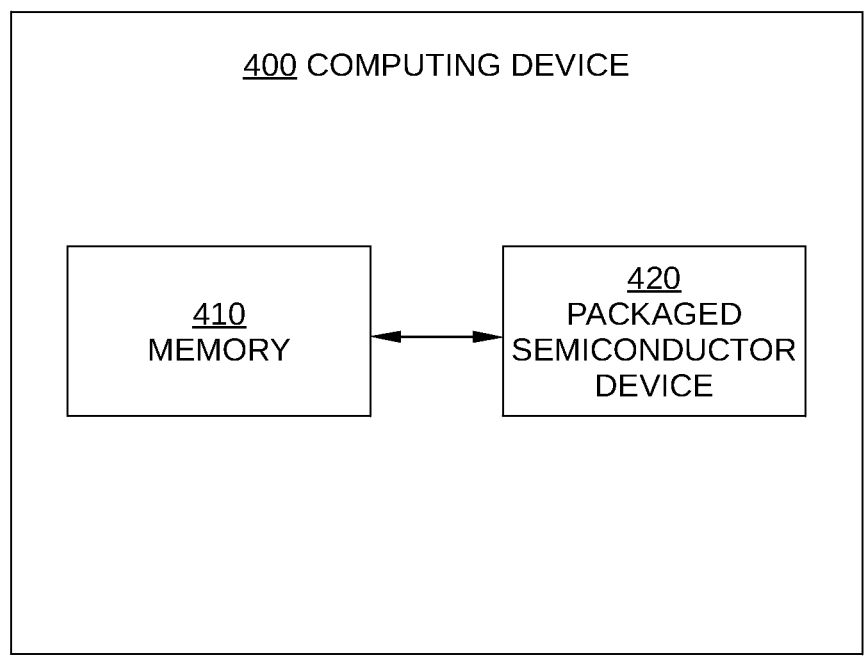
FIG. 4 illustrates a computing device in which one or more embodiments of the present invention can be implemented.

FIG. 4 illustrates a computing device in which one or more embodiments of the present invention can be implemented. Specifically, FIG. 4 is a block diagram of a computer system 400 with a packaged semiconductor device 420 configured according to an embodiment of the present invention. As shown, computer system 400 includes a memory 410 and a packaged semiconductor device 420 that is coupled to memory 410. Computer system 400 may be a desktop computer, a laptop computer, a smartphone, a digital tablet, a personal digital assistant, or other technically feasible computing device. Memory 410 may include volatile, non-volatile, and/or removable memory elements, such as random access memory (RAM), read-only memory (ROM), a magnetic or optical hard disk drive, a flash memory drive, and the like. Packaged semiconductor device 420 is substantially similar in organization and operation to IC system 100 or 200 described above in conjunction with FIGS. 1-3, and may comprise a CPU, a GPU, an application processor or other logic device, or any other IC chip-containing device.

In sum, embodiments of the invention set forth an IC system having a reduced package thickness. The IC system includes a heat spreader that is thermally coupled to a semiconductor chip and has a cavity or opening formed in the heat spreader and located so that capacitors and/or other passive devices mounted to the packaging substrate are at least partially disposed in the cavity or opening. Advantageously, the thickness of such an IC system is limited by the thickness of the IC chip rather than the height of passive components that are mounted on the same packaging substrate as the IC chip.

While the foregoing is directed to embodiments of the present invention, other and further embodiments of the invention may be devised without departing from the basic scope thereof, and the scope thereof is determined by the claims that follow.

We claim:
1. A system, comprising:
a semiconductor die mounted on a substrate;
a heat spreader that has a portion of a surface thereof thermally coupled to the semiconductor die and a cavity formed in the surface, wherein the cavity penetrates partially into the heat spreader, and wherein the portion of the surface is substantially coplanar with an opening into the cavity; and a passive device mounted on the substrate and at least partially disposed within the cavity.

2. The system of claim 1, further comprising a thermal interface material disposed between the heat spreader and the semiconductor die.

3. The system of claim 1, wherein the semiconductor die comprises one of a central processing unit and a graphics processing unit.

4. The system of claim 1, wherein the substrate comprises one of a packaging substrate and a packaging interposer.

5. The system of claim 1, wherein the passive device comprises one of a capacitor, a resistor and an inductor.

6. The system of claim 1, wherein the heat spreader comprises a material having a thermal conductivity equal to or greater than about 230 W m$^{-1}$ K$^{-1}$.

7. The system of claim 1, further comprising a plurality of passive devices mounted on the substrate, and a plurality of cavities formed in the surface, wherein each passive device is at least partially disposed within one of the cavities.

8. The system of claim 1, wherein the cavity comprises an opening that extends partially through the heat spreader.

9. The system of claim 1, wherein the semiconductor die is shorter than the passive device.

10. The system of claim 1, further comprising a second passive device that is mounted to the substrate and at least partially disposed within the cavity.

11. The system of claim 1, wherein the cavity comprises a back wall disposed within the heat spreader.

12. The system of claim 1, wherein the heat spreader includes a continuous interior chamber, and wherein the continuous interior chamber includes the semiconductor die and at least a portion of the passive device.

13. The system of claim 12, wherein the surface forms a boundary of the chamber.

14. The system of claim 12, wherein the surface comprises a plane.

15. The system of claim 1, wherein the portion of the surface defines a first plane, the opening into the cavity defines a second plane, and the first plane is coplanar with the second plane.

16. The system of claim 1, wherein the portion of the surface and the opening into the cavity reside at the same depth within the heat spreader relative to a top surface of the semiconductor die.

17. A computing device, comprising:
a memory; and
a packaged semiconductor device coupled to the memory, wherein the packaged semiconductor device comprises:
a semiconductor die mounted on a substrate;
a heat spreader that has a portion of a surface thereof thermally coupled to the semiconductor die and a cavity formed in the surface, wherein the cavity penetrates partially into the heat spreader, and wherein the portion of the surface is substantially coplanar with an opening into the cavity; and
a passive device mounted on the substrate and at least partially disposed within the cavity.

18. The computing device of claim 17, further comprising a thermal interface material disposed between the heat spreader and the semiconductor die.

19. The computing device of claim 17, wherein the semiconductor die comprises one of a central processing unit and a graphics processing unit.

20. The computing device of claim 17, wherein the substrate comprises one of a packaging substrate and a packaging interposer.

21. The computing device of claim 17, wherein the passive device comprises one of a capacitor, a resistor and an inductor.

22. The computing device of claim 17, wherein the heat spreader comprises a material having a thermal conductivity equal to or greater than about 230 W m$^{-1}$ K$^{-1}$.

23. The computing device of claim 17, further comprising a plurality of passive devices mounted on the substrate, and a plurality of cavities formed in the surface, wherein each passive device is at least partially disposed within one of the cavities.

24. The computing device of claim 17, wherein the cavity comprises an opening that extends partially through the heat spreader.

25. The computing device of claim 17, wherein the semiconductor die is shorter than the passive device.

26. The computing device of claim 17, further comprising a second passive device that is mounted to the substrate and at least partially disposed within the cavity.

27. The computing device of claim 17, wherein the cavity comprises a back wall disposed within the heat spreader.

* * * * *